(12) United States Patent
Mun

(10) Patent No.: US 11,569,598 B2
(45) Date of Patent: Jan. 31, 2023

(54) SMART KEY FOR VEHICLE

(71) Applicant: Continental Automotive GmbH, Hannover (DE)

(72) Inventor: JaeHo Mun, Singapore (SG)

(73) Assignee: CONTINENTAL AUTOMOTIVE GMBH, Hannover (DE)

( * ) Notice: Subject to any disclaimer, the term of this patent is extended or adjusted under 35 U.S.C. 154(b) by 183 days.

(21) Appl. No.: 17/167,500

(22) Filed: Feb. 4, 2021

(65) Prior Publication Data

US 2021/0257760 A1    Aug. 19, 2021

(30) Foreign Application Priority Data

Feb. 13, 2020 (KR) .................. 10-2020-0017640

(51) Int. Cl.
*H01R 12/70* (2011.01)
*H01M 50/548* (2021.01)
(Continued)

(52) U.S. Cl.
CPC ......... *H01R 12/7088* (2013.01); *E05B 19/00* (2013.01); *H01M 50/289* (2021.01);
(Continued)

(58) Field of Classification Search
CPC .............. H01R 12/7088; H01R 13/631; H01R 13/2442; H01R 13/2492; E05B 19/00; H01M 50/289; H01M 50/548; H01M 2220/30; H01M 50/202; H01M 50/216; H01M 50/247; H01M 50/264; H05K 1/181; H05K 2201/10037; H05K 2201/10393;
(Continued)

(56) References Cited

U.S. PATENT DOCUMENTS 6,722,916 B2 * 4/2004 Buccinna ............... H01R 12/57
439/500
7,499,283 B2 * 3/2009 De Los Santos ....... B60R 25/24
361/752
(Continued)

FOREIGN PATENT DOCUMENTS

CN    206388754 U    8/2017
EP    0226547 A2    6/1987
(Continued)

*Primary Examiner* — Abdullah A Riyami
*Assistant Examiner* — Nader J Alhawamdeh
(74) *Attorney, Agent, or Firm* — RatnerPrestia

(57) ABSTRACT

A smart key for a vehicle includes: a base part; a first terminal part coupled to the base part and which makes contact with a first electrode of a battery so as to be electrically connected to the battery; a second terminal part disposed facing the first terminal part to form an insertion part where the battery is inserted and which makes contact with a second electrode of the battery to be electrically connected to the battery; a separation prevention part which extends from the second terminal to the base part and which abuts the side surface of the battery to prevent the battery from separating from the insertion part; and a pressure applying part which is connected to the second terminal part so as to enable contact with the battery and which maintains contact between the battery and the separation prevention part by an elastic restoring force.

7 Claims, 8 Drawing Sheets

(51) Int. Cl.
  *H01M 50/289* (2021.01)
  *E05B 19/00* (2006.01)
  *H01R 13/631* (2006.01)
  *H05K 1/18* (2006.01)

(52) U.S. Cl.
  CPC ........ *H01M 50/548* (2021.01); *H01R 13/631* (2013.01); *H01M 2220/30* (2013.01); *H05K 1/181* (2013.01); *H05K 2201/10037* (2013.01)

(58) Field of Classification Search
  CPC ............ H05K 1/18; G07C 2009/00984; G07C 9/00944; G07C 9/00182; G07C 2009/00547; Y02E 60/10
  See application file for complete search history.

(56) References Cited

U.S. PATENT DOCUMENTS

| | | | | |
|---|---|---|---|---|
| 8,923,002 B2 * | 12/2014 | Rapisarda | ............ | F21V 23/023 361/810 |
| 10,796,864 B2 * | 10/2020 | Mun | ........................ | G05G 5/05 |
| 2007/0103850 A1 * | 5/2007 | Melman | ............. | G07C 9/00309 361/679.02 |
| 2016/0250996 A1 * | 9/2016 | Park | .................... | E05B 19/0082 701/2 |
| 2020/0013568 A1 * | 1/2020 | Mun | ....................... | H01H 13/84 |
| 2020/0357208 A1 * | 11/2020 | Hyun | ................. | H01M 50/216 |
| 2021/0257760 A1 * | 8/2021 | Mun | .................. | G07C 9/00944 |

FOREIGN PATENT DOCUMENTS

| | | |
|---|---|---|
| JP | 2009293247 A | 12/2009 |
| JP | 2012036668 A | 2/2012 |
| JP | 2014156700 A | 8/2014 |
| KR | 100980974 B1 | 9/2010 |
| KR | 20120012078 A | 2/2012 |
| KR | 101576476 B1 | 12/2015 |
| KR | 101853763 B1 | 5/2018 |

* cited by examiner

SMART KEY FOR VEHICLE

CROSS REFERENCE TO RELATED APPLICATIONS

This application claims priority to Korean Patent Application No. 10-2020-0017640, filed Feb. 13, 2020, the contents of such application being incorporated by reference herein.

FIELD OF THE INVENTION

The present invention relates to a smart key for a vehicle, and, more specifically, to a smart key for a vehicle in which a battery can be secured.

BACKGROUND OF THE INVENTION

Generally, smart keys are devices which operate using radio frequency identification (RFID) at long range in order to lock or unlock a vehicle door or to start the vehicle. Such smart keys may include fob keys and card keys. Smart keys are operated by means of an internal battery.

The securing structure for batteries in smart keys is a structure which is assembled by forcefully pressing the side surface of the battery and interference-fit coupling same by means of a hard contact rib or the like formed in a terminal, and thus deformation of the terminal can easily occur. Also, when the battery size is large compared to the securing structure of the battery, there is a problem in that assembling the battery is impossible as the battery cannot be inserted into the securing structure. Furthermore, when the battery size is small compared to the securing structure of the battery, there is a problem in that securing the battery is impossible and free movement may occur.

Background art with respect to the present invention is disclosed in Korean Registered Patent Publication KR 10-0980974 B1 (Published 7 Sep. 2010, Title of the Invention: SMART KEY OF VEHICLE HAVING BUTTON STARTING SYSTEM), which is incorporated by reference herein.

SUMMARY OF THE INVENTION

An aspect of the present invention is a smart key for a vehicle whereby battery assembly can be smoothly achieved and in which the battery can be secured.

In order to resolve the abovementioned problem, the smart key for a vehicle according to an aspect of the present invention comprises: a base part; a first terminal part which is coupled to the base part and which makes contact with a first electrode of a battery so as to be electrically connected to the battery; a second terminal part which is disposed facing the first terminal part so as to form an insertion part where the battery is inserted and which makes contact with a second electrode of the battery so as to be electrically connected to the battery; a separation prevention part which extends from the second terminal to the base part and which abuts the side surface of the battery so as to prevent the battery from separating from the insertion part; and a pressure applying part which is connected to the second terminal part so as to enable contact with the battery and which maintains contact between the battery and the separation prevention part by means of an elastic restoring force.

Furthermore, the separation prevention part and the pressure applying part are disposed in respectively opposite directions with respect to the maximum radius of the insertion part.

Furthermore, the pressure applying part comprises: a pressure-applying-part body which extends from the second terminal part towards the base part so as to be disposed facing the side surface of the battery and which is provided with a through hole; and a resilient part which is connected to the pressure-applying-part body so as to be movable through the through hole and which provides an elastic restoring force in the direction in which pressure is applied to the side surface of the battery.

Furthermore, the resilient part comprises: a bending part which bends towards the separation prevention part from the end part of the pressure-applying-part body; and a contact part which extends from the bending part and which makes contact with the battery.

Furthermore, the resilient part comprises a catching part which extends from the contact part towards the through hole, and the pressure applying part comprises a support part which abuts the catching part so as to restrict the movement of the catching part at the same time as supporting the resilient part.

Furthermore, the support part protrudes outside the pressure applying part and is bent to face the catching part so as to abut the catching part.

Furthermore, a plurality of pressure applying parts are provided in order to abut the battery at multiple points.

The assembly of the battery can be smoothly achieved in the smart key for a vehicle according to an embodiment of the present invention.

Furthermore, in the smart key for a vehicle according to an embodiment of the present invention, the battery can be secured by using the elastic pressure applying force of the pressure applying part.

Furthermore, the smart key for a vehicle according to an embodiment of the present invention can be applied to various sizes and shapes of batteries.

Furthermore, with the smart key for a vehicle according to an embodiment of the present invention, it is possible to prevent damage to the terminals or the battery as a result of elastically deforming to secure the battery with appropriate force.

Furthermore, the smart key for a vehicle according to an embodiment of the present invention can prevent free movement of the battery by restricting the range of elastic deformation.

DETAILED DESCRIPTION OF THE PREFERRED EMBODIMENTS

Figure 1:
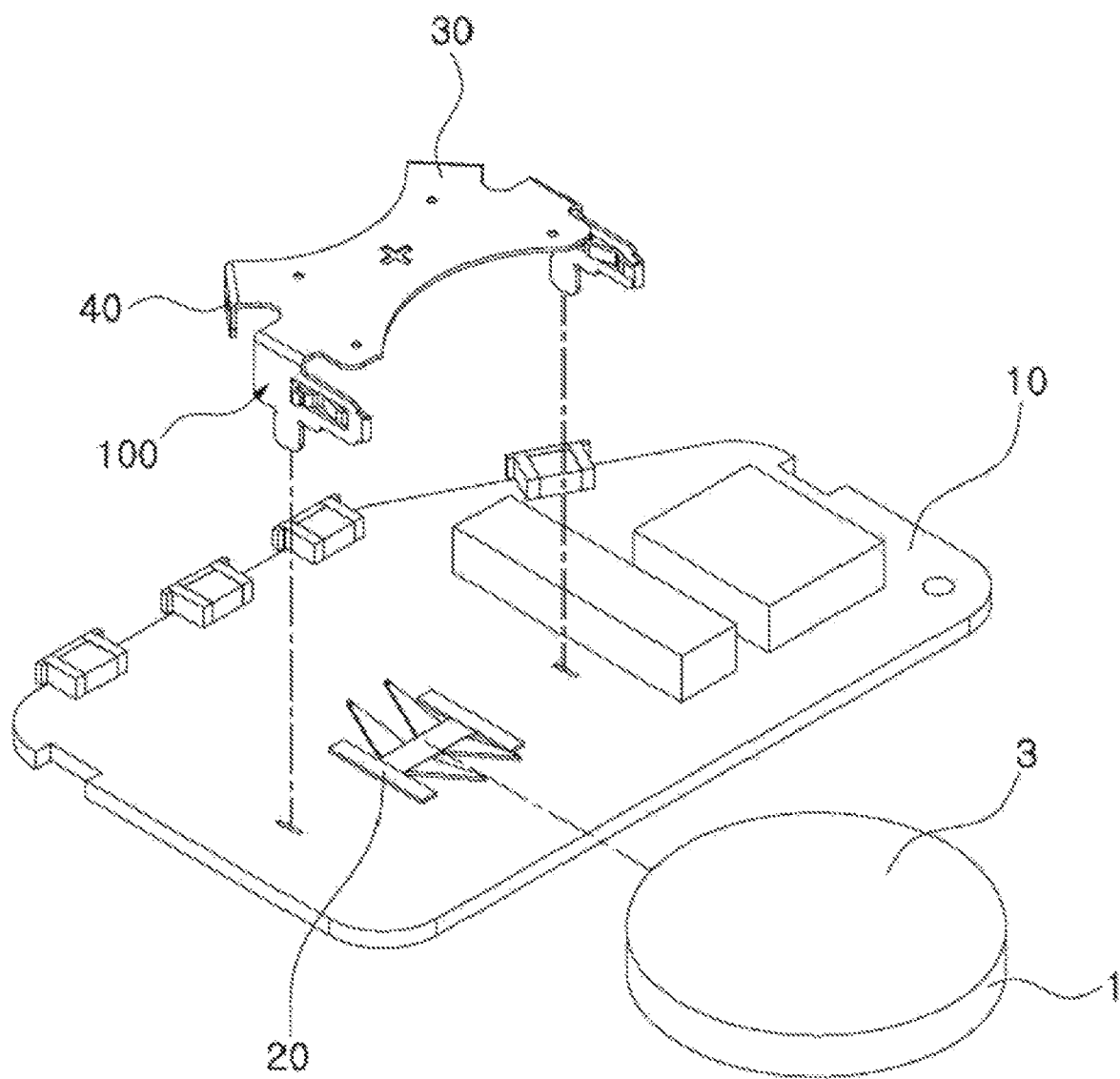
FIG. 1 is an exploded perspective view schematically showing the configuration of the smart key for a vehicle according to an embodiment of the present invention.

Hereinafter, an embodiment of a smart key for a vehicle according to the present invention will be described with reference to the accompanying drawings. In this process, details such as the thicknesses of lines and the sizes of components shown in the drawings may be exaggerated for clarity of the description and convenience.

In addition, the terms used in the following text are defined in relation to their functions in an aspect of the present invention, and can vary depending on the intention of the user or operator, or on customary practice. Therefore, definitions of these terms should be based on the content throughout the whole of this specification.

Figure 2:
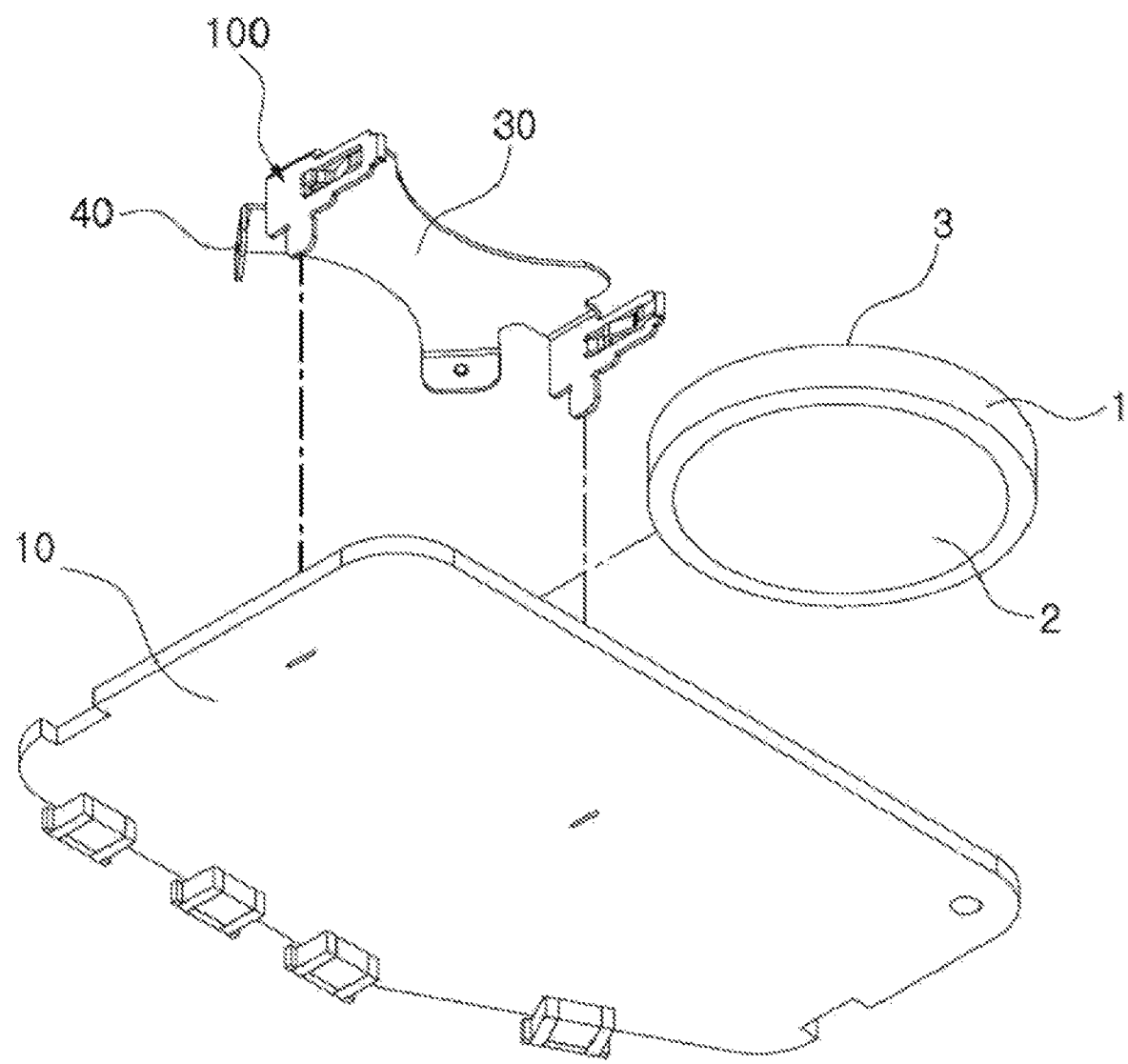
FIG. 2 is an exploded perspective view schematically showing from below the configuration of the smart key for a vehicle according to an embodiment of the present invention.
Figure 3:
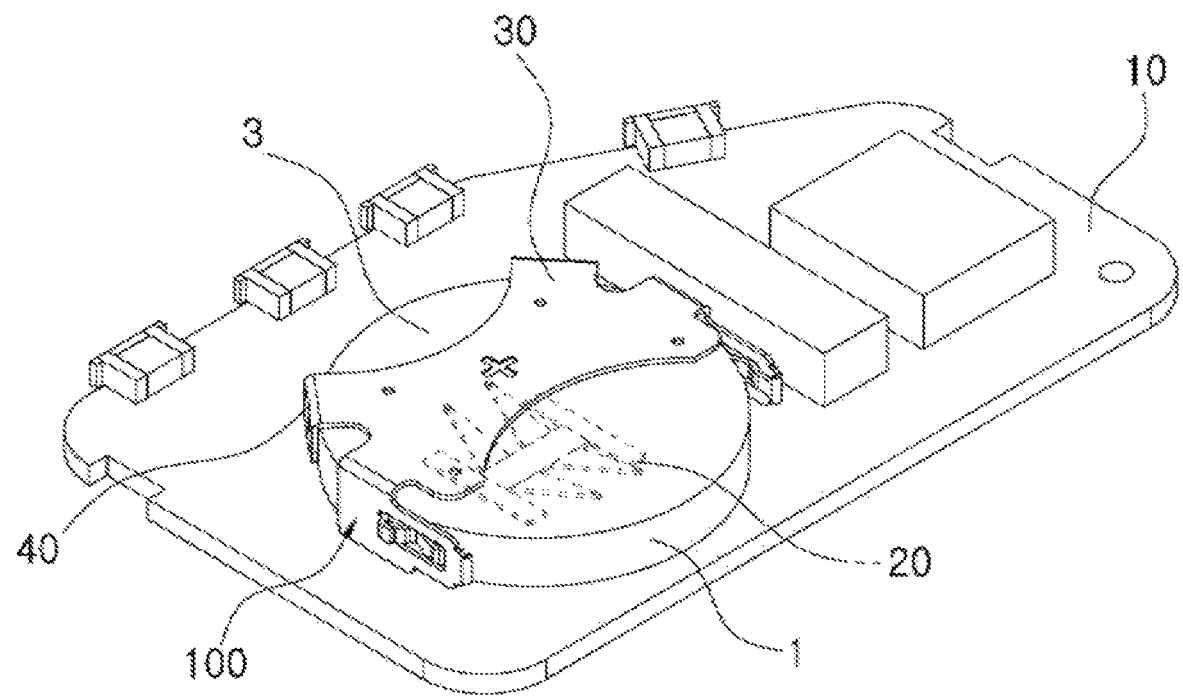
FIG. 3 is a combined perspective view schematically showing the configuration of the smart key for a vehicle according to an embodiment of the present invention.
Figure 4:
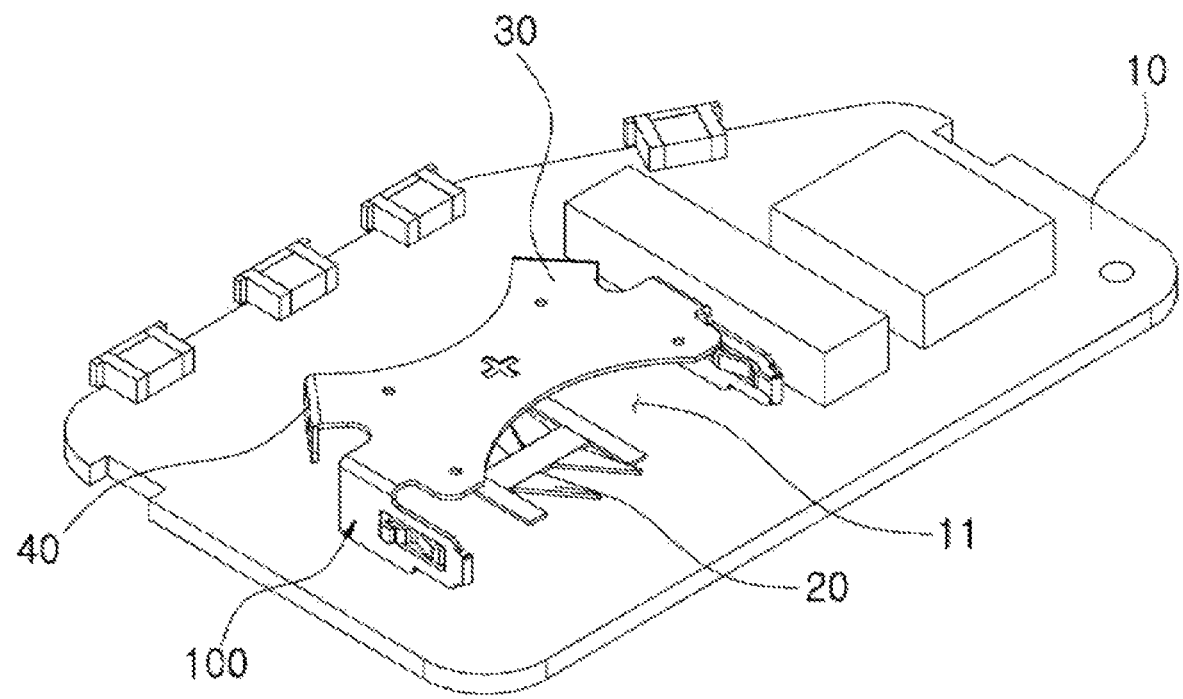
FIG. 4 is a combined perspective view schematically showing the configuration of the smart key for a vehicle, to which a battery has been coupled, according to an embodiment of the present invention.

FIG. 1 is an exploded perspective view schematically showing the configuration of the smart key for a vehicle according to an embodiment of the present invention; FIG. 2 is an exploded perspective view schematically showing from below the configuration of the smart key for a vehicle according to an embodiment of the present invention; FIG. 3 is a combined perspective view schematically showing the configuration of the smart key for a vehicle according to an embodiment of the present invention; and FIG. 4 is a combined perspective view schematically showing the configuration of the smart key for a vehicle, to which a battery has been coupled, according to an embodiment of the present invention.

Referring to FIGS. 1 and 2, the smart key for a vehicle according to an embodiment of the present invention comprises: a base part (10); a first terminal part (20); a second terminal part (30); a separation prevention part (40); and a pressure applying part (100).

The base part (10) is formed as a plate, has an electronic component for vehicular remote control mounted on one side or both sides thereof, and has a circuit formed thereon in order to guide an electric signal of the electronic component. The base part (10) according to one embodiment of the present invention consists of a plate-shaped printed circuit board (PCB), and can be mounted with electronic components such as antennas, electric devices and the like, for generating an electrical signal by means of the operation of one or more switches. The base part (10) is formed such that a case (not shown) can be installed thereon, and may comprise a coupling means which can couple to the case.

The battery (1) is coupled to the base part (10) so as to supply power to the base part (10). The battery (1) according to one embodiment of the present invention is formed in a cylindrical shape as shown in FIG. 1 and has a first electrode (2) with a (−) pole formed on the lower surface thereof and a second electrode (3) with a (+) pole formed on the upper surface thereof. However, the battery (1) is not limited to this shape or polarity, and various design changes are possible within the technical concept of the first electrode (2) and the second electrode (3) having the form of electrodes with opposite polarities.

The first terminal part (20) is coupled to base part (10) and makes contact with the first electrode (2) so as to be electrically connected to the battery (1). Preferably, the first terminal part (20) is made of a metallic material so as to enable electrical communication with the battery (1). The first terminal part (20) can be coupled to the base part (10) by means of a soldering process in which two different materials are joined by melting a low melting point filler metal. Accordingly, the first terminal part (20) can be electrically coupled with the base part (10) so as to supply battery (1) power to the electronic component(s) of the base part (10).

As shown in FIG. 2, the first terminal part (20) according to one embodiment of the present invention can be formed such that the terminal part is coupled to the base part (10) so as to protrude upwards from the base part (10). The first terminal part (20) can be formed so as to have sufficient elastic force towards the battery (1) when in contact with the first electrode (2) of the battery (1), so that more stable electrical contact with the battery (1) can be maintained. The first terminal part (20) is not limited to the shape shown in FIG. 1, and various design changes are possible within the technical concept of a shape which coupled to the base part (10) so as to protrude upwards from the base part (10). The first terminal part (20) can be formed so as to have sufficient elastic force towards the battery (1) when in contact with the first electrode (2) of the battery (1), so that more stable electrical contact with the battery (1) can be maintained. The first terminal part (20) is not limited to the shape shown in FIG. 1, and various design changes are possible within the technical concept of a shape which allows coupling to the insertion part (11) so as to allow contact with the first electrode (2) of the battery (1).

The second terminal part (30) makes contact with the second electrode (3) of the battery (1) so as to be electrically connected to the battery (1). The second terminal part (30) can be directly coupled to the base part (10), or, equally, can be indirectly coupled to the base part (10) by means of the separation prevention part (40) or the pressure applying part (100) which will be described later. The second terminal part (30) may consist of a metallic material so as to enable electrical communication with the battery (1), the same as for the first terminal part (20), and the second terminal part (30) can be coupled to the base part (10) by means of a soldering process. Accordingly, the second terminal part (30) can be electrically coupled with the base part (10) so as to supply battery (1) power to the electronic component(s) of the base part (10).

The second terminal part (30) is disposed spaced apart from and facing the first terminal part (20) so as to form the insertion part (11) where the battery is inserted. The insertion part (11) according to one embodiment of the present invention can be formed in a shape which corresponds to the shape of the battery (1) and which provides an empty space that is roughly cylindrical. However, neither one of the height or width of the insertion part (11) is limited, and various design changes are possible depending on the shape and size of the battery (1).

The second terminal part (30) according to one embodiment of the present invention is formed as a plate as shown in FIGS. 1 to 4, and is formed so as to be disposed horizontally and cover the upper surface of the battery, which is to say, the second electrode (3). When the second terminal part (30) is formed integrally with the separation prevention part (40) or the pressure applying part (100) which will be described later, the second terminal part (30) can be coupled to the base part (10) thereby, or, equally, can be coupled to the base part (10) by means of a separate coupling member (not shown). A contact protrusion, which protrudes towards the second electrode (3) of the battery (1) so as to be in electrical contact with the second electrode (3)

of the battery (1), can be formed on the second terminal part (30). The second terminal part (30) is not limited to such a shape, and various design changes are possible within the technical concept of a shape which allows coupling to the base part (10) so as to allow contact with the second electrode (3) and which can form the insertion part (11).

The separation prevention part (40) extends from the second terminal part (30) to the base part (10) and abuts the side surface of the battery (1) so as to prevent the battery (1) from separating from the insertion part (11). The separation prevention part (40) according to one embodiment of the present invention is formed as a plate which extends vertically from an end part of the second terminal part (30) towards the base part (10) and is formed so as to abut a portion of the side surface of the battery (1). Accordingly, the separation prevention part (40) blocks the insertion pathway of the battery (1) from an end part of the second terminal part (30) so as to be able to prevent the battery (1) from separating from the insertion part (11). A plurality of separation prevention parts (40) may be formed so as to abut the battery (1) at multiple points. The shape of the separation prevention part(s) (40) is not limited to a single shape, and various design changes are possible within the technical concept of extending from the second terminal part (30) to the base part (10) and abutting the side surface of the battery (1).

The pressure applying part (100) is connected to the second terminal part (30) so as to be capable of contact with the battery (1) and maintains the contact between the battery (1) and the separation prevention part (40) by means of elastic restoring force. The pressure applying part (100) is formed to provide elastic force towards the insertion part (11), which is to say, towards the side surface of the battery (1). Accordingly, when the battery (1) is assembled in the insertion part (11), the battery (1) can have pressure applied thereto so as to secure same. The pressure applying part (100) can be integrally formed with the second terminal part (30) or it is equally possible for the pressure applying part (100) to be formed in a manner allowing detachment from the second terminal part (30). A plurality of pressure applying parts (100) can abut the battery at multiple points. Accordingly, the pressure applying parts (100) can apply pressure to the battery (1) at several points so as to more effectively be able to prevent free movement of the battery (1).

The separation prevention part (40) and the pressure applying part (100) according to one embodiment of the present invention can be formed so as to be disposed in respectively opposite directions, with respect to the maximum radius of the insertion part (11). When the insertion part (11) is formed to correspond to the shape of the battery (1), the maximum radius of the insertion part (11) can be the same as the maximum radius of the battery (1) itself. According to one embodiment of the present invention, as shown in FIGS. 1 to 4, the battery (1) is formed in a cylindrical shape, and, when the insertion part (11) is formed as an empty space corresponding to said shape, the maximum radius of the insertion part (11) corresponds to the diameter length of the battery (1). In this case, with respect to the diameter of the battery (1), the separation prevention part (40) is formed so as to block one half of the circumference on one side of the battery (1), and the pressure applying part (100) is formed to apply pressure to the other half of the circumference. Accordingly, when the battery (1) is inserted into the insertion part (11), the vector direction of the pressure applying force received by the battery (1) due to the pressure applying part (100) can be oriented towards the separation prevention part (40) so that the securing force on the battery (1) can be strengthened.

Hereinbelow, the configuration of the pressure applying part (100) will be described in detail.

Figure 5:
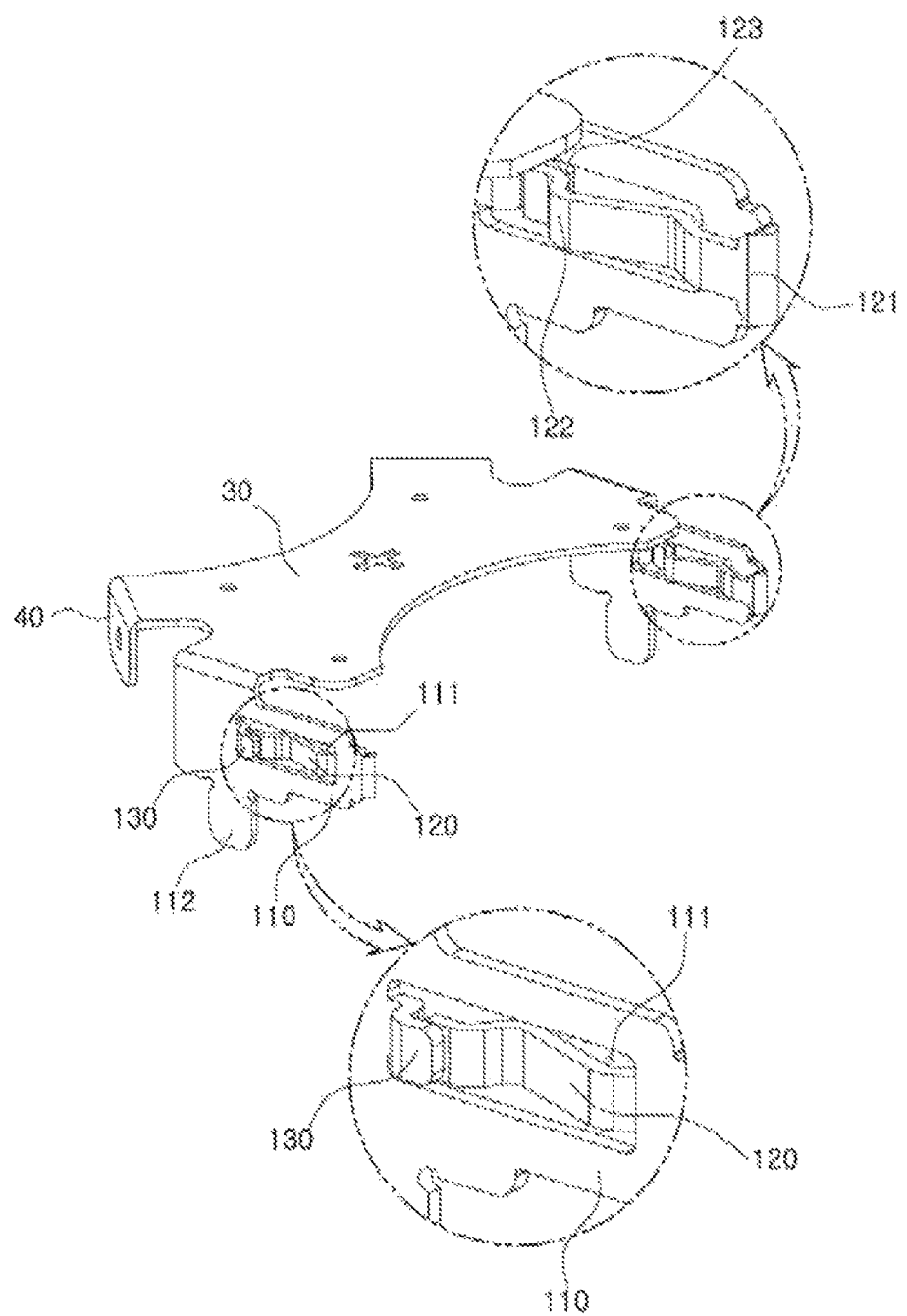
FIG. 5 is a perspective view schematically showing the configuration of the pressure applying unit according to an embodiment of the present invention.
Figure 6:
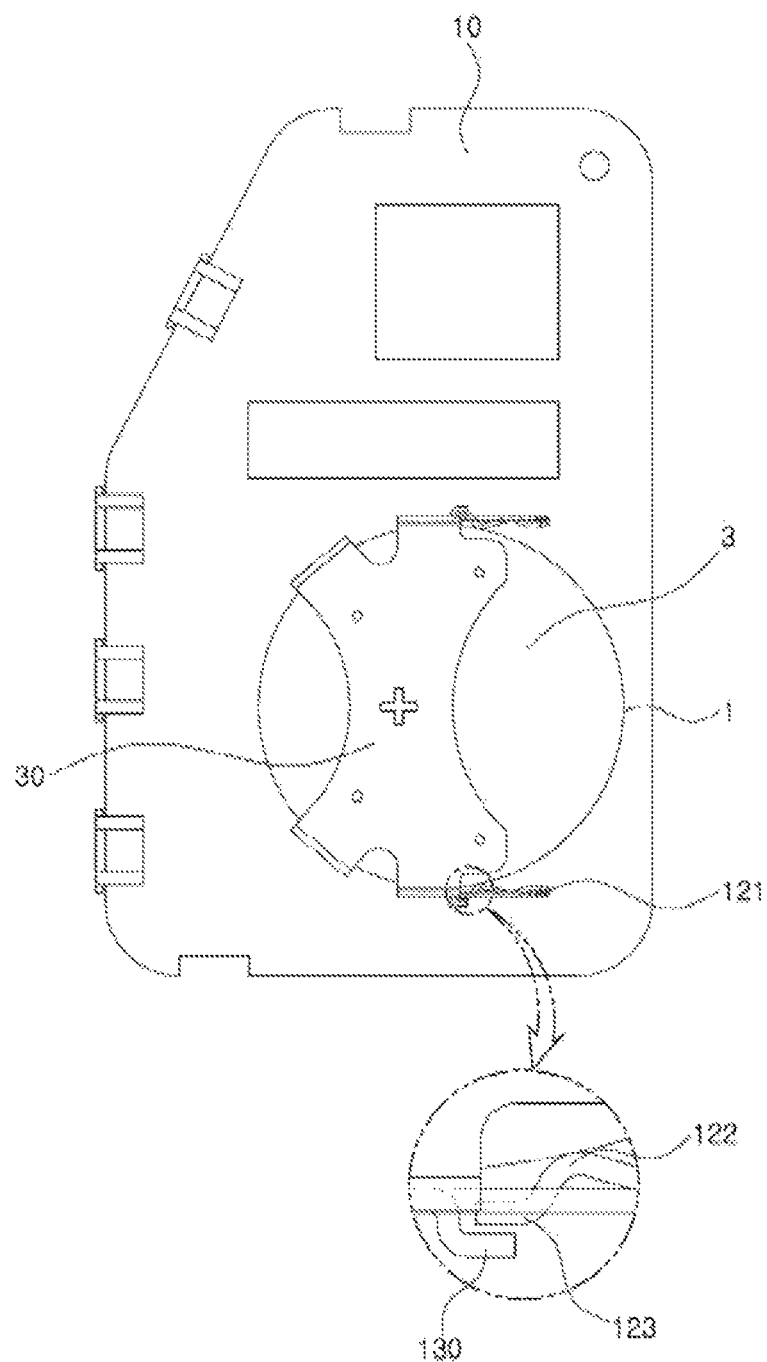
FIG. 6 is a drawing showing from the front the configuration of the pressure applying part according to an embodiment of the present invention.

FIG. 5 is a perspective view schematically showing the configuration of the pressure applying unit (100) according to an embodiment of the present invention; FIG. 6 is a drawing showing from the front the configuration of the pressure applying part (100) according to an embodiment of the present invention; and FIG. 7 is a drawing showing from above the configuration of the pressure applying part (100) according to an embodiment of the present invention.

Figure 7:
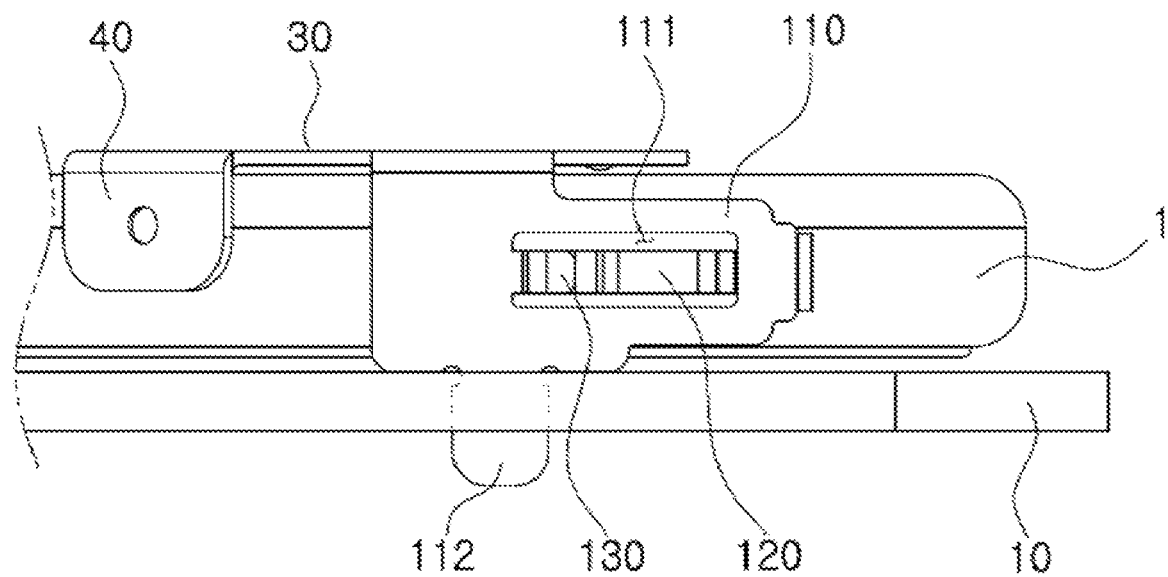
FIG. 7 is a drawing showing from above the configuration of the pressure applying part according to an embodiment of the present invention.

Referring to FIGS. 5 to 7, the pressure applying part (100) according to an embodiment of the present invention comprises a pressure-applying-part body (110), a resilient part (120), and a support part (130).

The pressure-applying-part body (110) extends from the second terminal part (30) towards the base part (10) and is disposed facing the side surface of the battery (1). A through hole (111) is formed in the pressure-applying-part body (110) so as to allow movement of the resilient part (120), which will be described later, through the through hole (111). The pressure-applying-part body (110) can be integrally formed with the second terminal part (30) or it is equally possible for the pressure applying part (100) to be formed in a manner allowing detachment from the second terminal part (30). As shown in FIGS. 5 to 7, the pressure-applying-part body (110) according to one embodiment of the present invention is formed in a plate shape which extends vertically from the second terminal part (30) towards the base part (10). A coupling protrusion (112) capable of coupling to the base part (10) is formed on the lower portion of the pressure-applying-part body (110) and is able to couple the second terminal part (30) to the base part (10). The through hole (111), which has the shape of a hole which is elongated in the longitudinal direction of the pressure-applying-part body (110) is formed on the pressure-applying-part body (110) so as to face the side surface of the battery (1). The pressure-applying-part body (110) is not limited to the shape shown in FIGS. 5 to 7, and various design changes are possible within the technical concept of a shape which extends from the second terminal part (30) towards to the base part (10) and has a through hole (111).

The resilient part (120) is connected to the pressure-applying-part body (110) so as to be able to move through the through hole (111), and has an elastic restoring force in the direction in which pressure is applied to the side surface of the battery (1). The resilient part (120) can be connected integrally with the pressure-applying-part body (110), or, equally, can be connected in a manner allowing detachment from the pressure-applying-part body (110). The resilient part (120) is formed to have a narrower width than the width of the through hole (111) and is formed so as to be able to move through the through-hole (111). Accordingly, the ease of assembly of the battery (1) can be improved. The resilient part (120) is preferably made of an elastic material such as a plastic or polymer material which is capable of elastic deformation so as to provide a space where the battery (1) is inserted.

The resilient part (120) according to one embodiment of the present invention can comprise a bending part (121), a contact part (122), and a catching part (123).

The bending part (121) is formed so as to bend from an end part of the pressure-applying-part body (110) towards the separation prevention part (40). The bending part (121) according to one embodiment of the present invention is formed integrally with the pressure-applying-part body (110) and is formed in a shape bent 180 degrees from the end part of the pressure-applying-part body (110) through a hemming process. Accordingly, the bending part (121) can be made such that the resilient part (120) can be connected to the pressure-applying-part body (110) and occupies a minimal amount of space.

The contact part (122) extends from the bending part (121) and is formed so as to contact the battery (1). The contact part (122) according to one embodiment of the present invention is formed extending from the bending part (121) towards the insertion part (11) so as to make contact with the side surface of the battery (1). The contact part (122) is bent to form a step so as to correspond to the side-surface curvature of the battery (1) at a point contacting the battery (1). Accordingly, when the battery (1) is inserted in the insertion part (11), the contact part (122) can secure the battery (1) by means of the step. The shape of contact part (122) is not limited to the shape shown in FIGS. 5 to 7, and various design changes are possible within the technical concept of a shape which extends from the bending part (121) and contacts the battery (1).

The catching part (123) is formed so as to extend from the contact part (122) towards the through hole (111). The catching part (123) according to one embodiment of the present invention is formed in a rod shape and extends from the bent portion of the contact part (122) in the direction moving away from the battery, which is to say, towards the through hole (111). The end part of the catching part (123) can be bent by a fixed angle so as to be parallel with the surface of the support part (130) which will be described later so as to enable smooth contact to be achieved with the support part (130). The shape of the catching part (123) is not limited to a single shape and various design changes are possible within the technical concept of a shape which is formed so as to extend from the contact part (122) towards the through hole (111).

When the battery (1) is separated from or inserted into the insertion part (11) or free movement occurs once the battery (1) has been inserted into the insertion part and the battery migrates to one side, the support part (130) abuts the catching part (123) so as to restrict the movement of the catching part (123) at the same time as supporting the resilient part (120). Preferably, the support part (130) consists of a suitably rigid material so as to be able to abut the catching part (123) and sufficiently sustain the load applied during the battery (1) insertion process or after insertion. The support part (130) according to one embodiment of the present invention protrudes outside the pressure applying part (100), which is to say, from the exterior surface of the pressure applying part (100) in the direction moving away from the side surface of the battery (1), and is bent so as to face the catching part (123) and so is formed so as to abut the catching part (123). The support part (130) can be integrally formed with the pressure applying part (100), or, equally, can be formed in a manner allowing detachment from the pressure applying part (100). The width of the support part (130) may be formed so as to be wider than the width of the catching part (123) so as to allow effective contact with the catching part (123). The support part (130) is not limited to the shape shown in FIGS. 5 to 7, and various design changes are possible within the technical concept of a shape which abuts the catching part (123) in order to restrict the movement of the catching part (123).

Hereinafter, the operation of the smart key for a vehicle according to an embodiment of the present invention will be described in detail.

Figure 8:
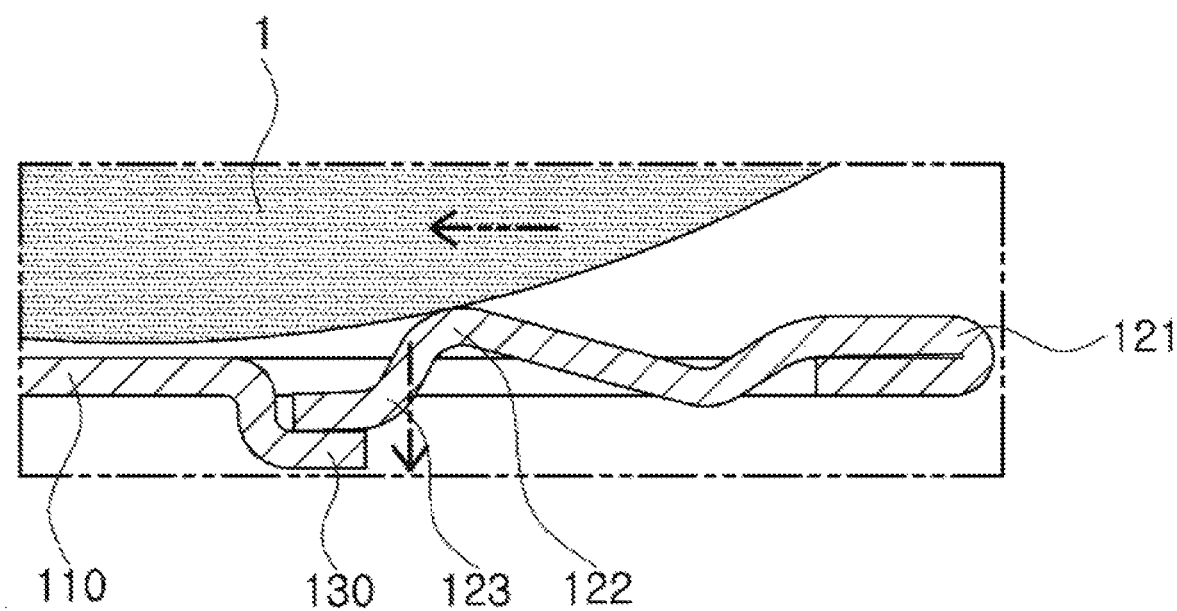
FIGS. 8 and 9 are operational views showing the operation of the smart key for a vehicle according to an embodiment of the present invention.
Figure 9:
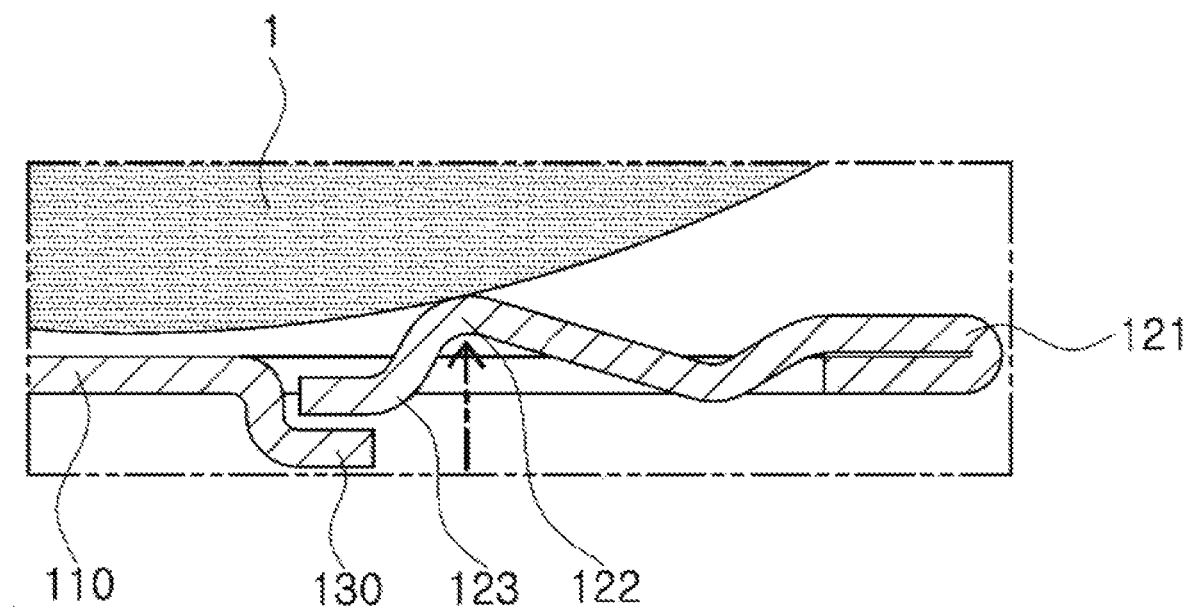

FIGS. 8 and 9 are operational views showing the operation of the smart key for a vehicle according to an embodiment of the present invention.

Referring to FIGS. 8 and 9, when the battery (1) is inserted through the insertion part (11), the battery (1) is slid in while in contact with the contact part (122) of the pressure applying part (100). As a result of the battery (1) being inserted, the contact part (122) widens towards the through hole (111), and this widening operation occurs until the maximum diameter of the battery (1) is reached. Furthermore, when the catching part (123) which is connected to the contact part (122) abuts the support part (130) before the maximum diameter of the battery (1) is reached, the resilient part (120) elastically deforms to allow the insertion of the battery (1).

Thereafter, when the battery (1) is completely inserted, the contact part (122) applies pressure to the side surface of the battery (1) by means of an elastic restoring force. The pressure applying force applied to the battery (1) is transferred towards the separation prevention part (40), and accordingly the battery (1) is secured in a state of contact with the separation prevention part (40).

When the battery (1) is shaken inside the insertion part (11) due to use or vibration and the like of the smart key, the battery (1) migrates to one side and the contact part (122) is pushed in the direction of the through hole (111). As a result of the contact part (122) being moved, the catching part (123) which is connected to the contact part (122) is itself also moved through the through hole (111). When the catching part (123) is moved by more than a fixed distance, the catching part (123) abuts the support part (130) which is formed on the outside of the pressure-applying-part body (110) and further movement is restricted.

With the smart key for a vehicle according to an embodiment of the present invention, the assembly of the battery can be smoothly achieved by means of the configuration and operation described above.

Furthermore, with the smart key for a vehicle according to an embodiment of the present invention, the battery can be secured by using the elastic pressurizing force.

Furthermore, the smart key for a vehicle according to an embodiment of the present invention can be applied to various sizes and shapes of batteries.

Furthermore, the smart key for a vehicle according to an embodiment of the present invention can prevent damage to the terminals or the battery as a result of elastically deforming to fasten the battery with appropriate force.

Furthermore, the smart key for a vehicle according to an embodiment of the present invention can prevent free movement of the battery by restricting the range of elastic deformation.

Although the present invention has been described with reference to the embodiments illustrated in the drawings, this is merely illustrative. It will be understood by those skilled in the art to which the present technology belongs that it is possible to implement various modifications and other equivalent embodiments based thereon.

Therefore, the scope of technical protection of the present invention should be determined by the following claims.

[Description of the Reference Numerals]

| | |
|---|---|
| 1: Battery | 2: First electrode |
| 3: Second electrode | 10: Base part |
| 11: Insertion part | 20: First terminal part |
| 30: Second terminal part | 40: Separation prevention part |

-continued

[Description of the Reference Numerals]

| | |
|---|---|
| 100: Pressure applying part | 110: Pressure applying body |
| 111: Through hole | 112: Coupling protrusion |
| 120: Elastic part | 121: Bending part |
| 122: Contact part | 123: Catching part |
| 130: Support part | |

The invention claimed is:

1. A smart key for a vehicle comprising: a base part; a first terminal part which is coupled to the base part and which makes contact with a first electrode of a battery so as to be electrically connected to the battery; a second terminal part which is disposed facing the first terminal part to form an insertion part where the battery is inserted and which makes contact with a second electrode of the battery so as to be electrically connected to the battery; a separation prevention part which extends from the second terminal to the base part and which abuts a side surface of the battery so as to prevent the battery from separating from the insertion part; and a pressure applying part which is connected to the second terminal part so as to enable contact with the battery and which maintains contact between the battery and the separation prevention part by an elastic restoring force; wherein the pressure applying part comprises: a pressure-applying-part body which extends from the second terminal part towards the base part so as to be disposed facing the side surface of the battery and which is provided with a through hole; and a resilient part which is connected to the pressure-applying-part body so as to be movable through the through hole and which provides an elastic restoring force in the direction in which pressure is applied to the side surface of the battery.

2. The smart key for a vehicle as claimed in claim 1, wherein
the separation prevention part and the pressure applying part are disposed in respectively opposite directions with respect to a maximum radius of the insertion part.

3. The smart key for a vehicle as claimed in claim 1, the resilient part comprises: a bending part which bends towards the separation prevention part from an end part of the pressure-applying-part body; and a contact part which extends from the bending part and which makes contact with the battery.

4. The smart key for a vehicle as claimed in claim 3, wherein
the resilient part comprises a catching part which extends from the contact part towards the through hole, and
the pressure applying part comprises a support part which abuts the catching part so as to restrict the movement of the catching part at the same time as supporting the resilient part.

5. The smart key for a vehicle as claimed in claim 4, wherein
the support part protrudes outside the pressure applying part and is bent to face the catching part so as to abut the catching part.

6. The smart key for a vehicle as claimed in claim 1, wherein
the second terminal part is coupled to the base part.

7. The smart key for a vehicle as claimed in claim 1 wherein
a plurality of pressure applying parts are provided in order to abut the battery at multiple points.

* * * * *